United States Patent
Hashemi et al.

(10) Patent No.: US 10,615,271 B2
(45) Date of Patent: Apr. 7, 2020

(54) III-V LATERAL BIPOLAR JUNCTION TRANSISTOR ON LOCAL FACETTED BURIED OXIDE LAYER

(71) Applicant: INTERNATIONAL BUSINESS MACHINES CORPORATION, Armonk, NY (US)

(72) Inventors: Pouya Hashemi, White Plains, NY (US); Mahmoud Khojasteh, Poughkeepsie, NY (US); Tak H. Ning, Yorktown Heights, NY (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/819,622

(22) Filed: Nov. 21, 2017

(65) Prior Publication Data
US 2019/0157433 A1    May 23, 2019

(51) Int. Cl.
| | | |
|---|---|---|
| *H01L 29/737* | (2006.01) | |
| *H01L 29/06* | (2006.01) | |
| *H01L 29/66* | (2006.01) | |
| *H01L 29/205* | (2006.01) | |
| *H01L 21/762* | (2006.01) | |
| *H01L 21/306* | (2006.01) | |

(52) U.S. Cl.
CPC ...... *H01L 29/737* (2013.01); *H01L 21/30617* (2013.01); *H01L 21/76232* (2013.01); *H01L 29/0649* (2013.01); *H01L 29/205* (2013.01); *H01L 29/66318* (2013.01)

(58) Field of Classification Search
CPC .... H01L 21/76264–21/76291; H01L 29/0649; H01L 29/735; H01L 29/737; H01L 29/66234–29/66356; H01L 29/6625; H01L 29/66318
See application file for complete search history.

(56) References Cited

U.S. PATENT DOCUMENTS

| | | | | |
|---|---|---|---|---|
| 4,397,711 A | * | 8/1983 | Donnelly | .......... H01L 21/30617 204/192.32 |
| 5,102,812 A | * | 4/1992 | Caneau | ............. H01L 21/30612 257/197 |
| 7,067,858 B2 | | 6/2006 | Hase | |
| 8,288,758 B2 | | 10/2012 | Ning et al. | |
| 8,420,493 B2 | | 4/2013 | Ning et al. | |

(Continued)

*Primary Examiner* — Tucker J Wright
*Assistant Examiner* — Mark Hatzilambrou
(74) *Attorney, Agent, or Firm* — Tutunjian & Bitetto, P.C.; L. Jeffrey Kelly (57) ABSTRACT

A bipolar junction transistor (LBJT) device that includes a base region of a first III-V semiconductor material having A first band gap; and emitter and collector regions present on opposing sides of the base region, wherein the emitter and collector regions are comprised of a second III-V semiconductor material having a wider band gap than the first III-V semiconductor material. A dielectric region is present underlying the base region, emitter region and the collect region. The dielectric region has an inverted apex geometry. The sidewalls of dielectric region that extend to the apex of the inverted apex geometry are present on facets of a supporting substrate III-V semiconductor material having a {110} crystalline orientation.

12 Claims, 9 Drawing Sheets

(56) References Cited

U.S. PATENT DOCUMENTS

| | | |
|---|---|---|
| 8,674,454 B2 | 3/2014 | Ko et al. |
| 9,059,016 B1 | 6/2015 | Hekmatshoar-Tabari et al. |
| 2007/0102735 A1* | 5/2007 | Kanemoto ........ H01L 21/82387 257/288 |
| 2009/0127615 A1* | 5/2009 | Sonsky ............. H01L 21/76264 257/330 |
| 2015/0228769 A1* | 8/2015 | Leidy .................. H01L 29/7371 257/197 |
| 2016/0079233 A1 | 3/2016 | Deboy et al. |
| 2017/0294525 A1 | 10/2017 | Hashemi et al. |

* cited by examiner

III-V LATERAL BIPOLAR JUNCTION TRANSISTOR ON LOCAL FACETED BURIED OXIDE LAYER

BACKGROUND

Technical Field

The present disclosure relates to a bipolar junction transistor (BJT) structure, and more particularly to lateral bipolar junction transistors.

Description of the Related Art

Heterojunction bipolar junction transistors (HBTs) known in the art include a heterojunction, i.e., a junction of two semiconductor materials having different band gaps, that coincide with a p-n junction between the base and the emitter. The heterojunction at which two different semiconductor materials having different band gaps are joined coincide with the p-n junction. The wider band gap of the emitter relative to the band gap of the base in an HBT increases the current gain relative to a bipolar junction transistor employing a same semiconductor material across the base and the emitter and having similar physical dimensions and doping profiles for the base and emitter.

SUMMARY

In one aspect, the present disclosure provides a lateral bipolar junction transistors (LBJT) device. The bipolar junction transistor may include a base region of a first III-V semiconductor material having the first band gap; and emitter and collector regions present on opposing sides of the base region. The emitter and collector regions are composed of a second III-V semiconductor material having a wider band gap than the first III-V semiconductor material. A dielectric region is present underlying the base region, emitter region and the collect region. The dielectric region has an inverted apex geometry. The sidewalls of the dielectric region extending to the apex of the inverted apex geometry are present on facets of a supporting substrate III-V semiconductor material having a {110} crystalline orientation.

In another embodiment, the bipolar junction transistor includes a substrate of a III-V semiconductor material having a trench with an inverted apex geometry. The sidewalls of the trench that lead to the inverted apex are provided by facets of the supporting substrate III-V semiconductor material having a {110} crystalline orientation. A dielectric fill is present within the trench having the inverted apex geometry. The dielectric fill having a planar surface opposite a base of the dielectric fill that is in contact with the inverted apex of the trench. The base region of the bipolar junction transistor is present between an emitter region and a base region of the bipolar junction transistor. The emitter region, base region and the collector region of the bipolar junction transistor are present on the planar surface of the dielectric fill.

In another aspect, a method of forming a bipolar junction transistor is provided that includes forming a III-V semiconductor material for a base region atop a III-V semiconductor substrate; and forming emitter and collector regions on opposing sides of the base region. In a following step, the III-V semiconductor substrate is etched selectively to facets having a {110} crystalline orientation. The etch process provides a trench having the inverted apex geometry underlying at least the base region.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The term "bipolar junction transistor (BJT)" denotes is a semiconductor device formed by two P-N junctions whose function is amplification of an electric current. Bipolar transistors are made from 3 sections of semiconductor material, i.e., alternating P-type and N-type conductivity semiconductor materials, with two resulting P-N junctions. As will be described in greater detail below the (BJT) devices disclosed herein are lateral bipolar junction transistors (LBJT). The term "lateral" as used to describe a BJT device denotes that means that the dimension extending from the beginning of the emitter through the base to the collector is horizontally orientated or is parallel with the upper surface of the substrate in which the emitter/base/collector, i.e., NPN or PNP junction, is formed. The LBJT devices disclosed herein are composed of type III-V semiconductor materials. The term "III-V semiconductor" denotes a semiconductor material that includes at least one element from Group III of the Periodic Table of Elements and at least one element from Group V of the Periodic Table of Elements. Typically, the III-V compound semiconductors are binary, ternary or quaternary alloys including III/V elements. In contrast to type III-V semiconductor materials, by "type IV semiconductor" it is meant that the semiconductor material includes at least one element from Group IVA (i.e., Group 14) of the Periodic Table of Elements.

The present disclosure provides lateral bipolar junction transistors (LBJT), and methods of forming LBJT devices including III-V semiconductor materials. III-V semiconductor materials are great candidates for lateral bipolar junction transistors and can offer high cut off frequency for both NPN and PNP types. Additionally, in some applications a high voltage LBJT device is preferred for high voltage applications. In some scenarios, the LBJT device is to be disconnected from the underlying supporting semiconductor substrate, leading to the LBJT being formed on a semiconductor on insulator (SOI) substrate. Type III-V semiconductor on insulator substrates are not readily available for commercial production.

The methods and structures provided by the present disclosure form lateral bipolar junction transistors on III-V semiconductor materials, e.g., type III-V semiconductor substrates, followed by selectively etching the type III-V semiconductor material under the base region of the lateral bipolar junction transistor. The etch process may also extend laterally under the emitter and collector regions of the lateral bipolar junction transistor. In some embodiments, some over-etch may be desirable to disconnect the emitter/collector from the substrate. The cavity that is formed by the aforementioned etch process may be filled with an isolating material, e.g., a dielectric material, such as an oxide, creating a buried oxide isolation region. This process provides a III-V lateral bipolar junction transistor on any kind of III-V supporting structure. The methods and structures of the present disclosure are now described with greater detail with reference to FIGS. 1-9.

Figure 1:
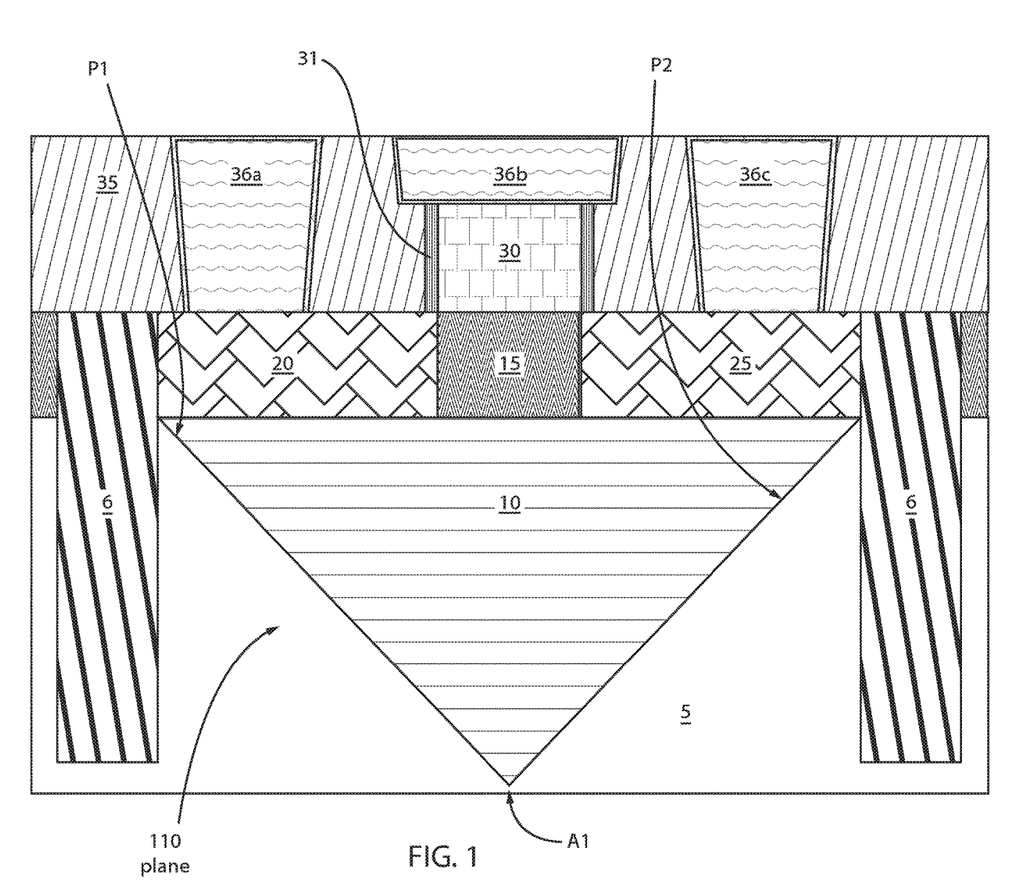
FIG. 1 is a side cross-sectional view of a lateral bipolar junction transistor (LBJT) device that includes a dielectric region that is present underlying the base region, the emitter region and the collect region of the device, wherein the dielectric region has an inverted apex geometry, in which the sidewalls of the dielectric region that extend to the apex of the inverted apex geometry are present on facets of a supporting substrate III-V semiconductor material having a {110} crystalline orientation, in accordance with one embodiment of the present disclosure.

FIG. 1 depicts one embodiment of an LBJT device that includes a base region 15 of a first III-V semiconductor material having the first band gap; and emitter regions 20 and collector regions 25 present on opposing sides of the base region 15. The emitter region 20 and collector region 25 are comprised of a second III-V semiconductor material having a wider band gap than the first III-V semiconductor material that provides the base region 15. The term "band gap" refers to the energy difference between the top of the valence band (i.e., EV) and the bottom of the conduction band (i.e., EC).

For example, in some embodiments, the first III-V semiconductor material that provides the base region 15 is composed of indium gallium arsenide (InGaAs). In some examples, indium gallium arsenide (InGaAs) has a band gap of about 0.8 eV. In one example, to provide that the emitter region 20 and the collector region 25 have a wider band gap than the base region 15, the emitter region 20 and the collector region 25 may be provided by a type III-V semiconductor material, in which aluminum (Al) is incorporated to increase the band gap of the material. For example, each of the emitter region 20 and the collector region 25 may be composed of indium gallium aluminum arsenide (InGa(Al)As). As will be described in further detail below, each of the emitter region 20, the base region 15 and the collector region 25 may be formed using an epitaxial deposition process.

The base region 15 is the region where an input current triggers a larger current from the emitter region 20 to the collector region 25 of the transistor. The role of the base region 15 is to function as an amplifier which causes the emitter-to-collector current to be significantly larger than the base current. When the base current receives an input current, a larger current then flows from the emitter region 20 to the collector region 25.

The base region 15 of the transistor has an opposite polarity, i.e., conductivity type, from the emitter region 20 and the collector region 25. The term "conductivity type" means that a region is either doped to an n-type conductivity or a p-type conductivity. For example, when the base region 15 is doped to an n-type conductivity, the emitter region 20 and the collector region 25 is doped to a p-type conductivity, and the transistor is referred to as a PNP transistor. In another example, when the base region 15 is doped to a p-type conductivity, the emitter region 20 and the collector region 25 is doped to an n-type conductivity, and the transistor is referred to as an NPN transistor. In an NPN bipolar transistor, the collector current is due to electrons flowing from the emitter region 20 to the collector region 25. In an PNP bipolar transistor, the collector current is due to holes flowing from the emitter region 20 to the collector region 25.

In some embodiments, the base region 15 is composed of an epitaxially formed in situ doped III-V semiconductor material that may be single crystal or polycrystalline. The base region 15 is typically doped to an n-type or p-type conductivity using a dopant concentration that is less than the dopant concentration in the overlying extrinsic base region 30. For example, the dopant that dictates the conductivity type of the base region 15 may be present in the III-V semiconductor material that provides the base region 15 in a concentration ranging from $10^{16}$ atoms/cm$^3$ to $10^{19}$ atoms/cm$^3$.

Still referring to FIG. 1, the emitter region 20 and the collector region 25 may be present on opposing sides of the base region 15. The emitter region 20, and the collector region 25 may be composed of epitaxially formed in situ doped III-V semiconductor material. The in situ doped III-V semiconductor material for the emitter region and collector region 20, 25 may be single crystal or polycrystalline.

In some embodiments, the epitaxially formed in situ doped III-V semiconductor material that provides the emitter region 20, and the collector region 25 may be composed of a material having a band gap substantially equal to the band gap of the band gap of the base region 15. For example, the in situ doped III-V semiconductor material that provides the emitter region 15, and the collector region 20 may be composed of the same III-V semiconductor material of the base region 10. In other embodiments, the epitaxially formed in situ doped III-V semiconductor material that provides the emitter region 20, and the collector region 25 may be composed of a material having a band gap that is greater than the band gap of the III-V semiconductor material of the base region 15.

The emitter region 20 and the collector region 25 are typically doped to a conductivity type that is opposite the conductivity type of the base region 15. For example, if the base region 15 is doped to an n-type conductivity, the emitter region 20 and the collector region 25 are doped to a p-type conductivity. For example, if the base region 15 is doped to a p-type conductivity, the emitter region 20 and the collector region 25 are doped to an n-type conductivity. The dopant that dictates the conductivity type of the emitter region 20 and the collector region 25 may be present in the III-V semiconductor material that provides the emitter region 20 and collector region 25 in a concentration ranging from $10^{18}$ atoms/cm$^3$ to $10^{21}$ atoms/cm$^3$. In some embodiments, the device design may include that the emitter region 20 and collector region 25 are doped more heavily than the base region 15.

In some embodiments, a dielectric region 10 is present underlying the base region 15, emitter region 20 and the collect region 25. In some embodiments, the dielectric region 10 has an inverted apex geometry, wherein sidewalls of dielectric region extending to the apex A1 of the inverted apex geometry are present on facets P1, P2 of a supporting substrate III-V semiconductor material 5. In some embodiments, the facets P1, P2 of the supporting substrate III-V semiconductor material have a {110} crystalline orientation.

In some embodiments, each facet P1, P2 provides a substantially linear sidewall for a notch (also referred to as a trench with an inverted apex geometry) that is angled at approximately 45° relative to an upper surface of the plane in the direction extending from the upper surface of the emitter region 20 extending across the base region 15 to the collector region 25. Each facet P1, P2 may extend from a sidewall of an isolation trench 6 formed in the supporting substrate III-V semiconductor material 5. As depicted in FIG. 1, the two facets P1, P2 intersect at an apex A1 providing the base of the dielectric region 10. Because the apex A1 is pointed downward, i.e., in a direction away from the overlying emitter region 20, base region 15 and collector region 25, the apex A1 may be referred to as inverted. For example, an inverted apex A1 is the geometry of the base of the dielectric region 10. For example, the dielectric region 10 may be provided by a dielectric fill present within the trench that is formed in the supporting substrate III-V semiconductor material 5 having the inverted apex geometry. The dielectric region 10, i.e., dielectric fill, having a planar surface opposite a base of the dielectric fill that is in contact with the inverted apex of the trench. The planar surface is the surface of the dielectric region 10 that is contacting the emitter region 20, base region 15 and the collector region 25.

The dielectric region 10 may be provided by any dielectric material that can be formed using a flowable dielectric process. For example, the dielectric region 10 may be composed of organosilicate glass (OSG), fluorine doped silicon dioxide, carbon doped silicon dioxide, porous silicon dioxide, porous carbon doped silicon dioxide, spin-on organic polymeric dielectrics (e.g., SILK™), hydrogen silsesquioxane (HSQ), methylsilsesquioxane (MSQ), and combinations thereof.

The supporting substrate III-V semiconductor material 5 can be provided by an indium containing III-V semiconductor material. For example, the supporting substrate III-V semiconductor substrate 5 may be composed of indium phosphide (InP). It is noted that other III-V semiconductor materials can provide the supporting substrate III-V semiconductor material 5 so long as the material may be etched to provide the facets P1, P2 leading to the inverted apex A1 structure depicted in FIG. 1. For example, the III-V semiconductor material may provide the material selected be etched with a hydrochloric etch that is selective to facets of the material for the supporting substrate III-V semiconductor material having a {110} crystalline orientation. Examples of other type III-V semiconductor materials besides indium phosphide (InP) that may be suitable for the supporting substrate III-V semiconductor material may include indium antimonide (InSb), indium arsenic (InAs), indium nitride (InN), indium gallium phosphide (InGaP), indium gallium nitride (InGaN), indium arsenide antimonide (InAsSb), indium gallium antimonide (InGaSb), aluminum gallium indium phosphide (AlGaInP), indium gallium arsenide phosphide (InGaAsP), indium arsenide antimonide phosphide (InArSbP), aluminum indium arsenide phosphide (AlInAsP), indium gallium arsenide nitride (InGaAsN), indium aluminum arsenide nitride (InAlAsN), gallium indium nitride arsenide aluminum antimonide (GaInNAsSb), gallium indium arsenide antimonide phosphide (GaInAsSbP), and combinations thereof (including combinations with indium phosphide).

In some embodiments, the dielectric region 10 is an air gap. In the embodiments, in which the dielectric region 10 is an air gap, the emitter region 20, base region 15 and the collector region 10 are suspended over a trench, i.e., air gap, having a base provided by the inverted apex geometry described above resulting from the facets P1, P2, i.e., angled facets of approximately 45°, intersecting at the downward pointing apex A1.

Still referring to FIG. 1, the isolation regions 6 may be trench isolation regions having a depth that extends through the emitter region 20 and collector region 25 into the supporting substrate III-V semiconductor material 5. The isolation regions 6 may be composed of any dielectric material, such as an oxide, nitride or oxynitride material. For example, the isolation region 6 may be composed of silicon oxide (SiO$_2$). The isolation regions 6 positioned on opposing sides of the functional features of the lateral bipolar junction transistor provide for device isolation.

Referring to FIG. 1, the lateral bipolar junction transistor of claim 1 further comprising an extrinsic base region 30 comprised of a doped polycrystalline III-V semiconductor material or a doped single crystalline III-V semiconductor material that is present atop the base region. Examples of III-V semiconductor materials suitable for the extrinsic base region 30 include indium aluminum arsenic (InAlAs), indium gallium arsenide (InGaAs), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), and combinations thereof. The extrinsic base region 30 is typically doped to a same conductivity type as the base region 15. For example, if the base region 15 is doped to an n-type conductivity, the extrinsic base region 30 is also doped to an n-type conductivity. The dopant concentration of the extrinsic base region 30 is typically greater than the dopant concentration of the base region 15. For example, the dopant concentration of the n-type or p-type dopant in the extrinsic base region 30 may range from $10^{18}$ atoms/cm$^3$ to $10^{21}$ atoms/cm$^3$. The extrinsic base region 30 is present within the width of the base region 10. Spacers 31 of a dielectric material, such as an oxide, nitride or oxynitride material, are present on the sidewalls of the extrinsic base region 30.

In some embodiments, the LBJT device that is depicted in FIG. 1 may be suitable for high speed applications. FIGS. 2-9 depict one embodiment of a method for forming the LBJT devices depicted in FIG. 1.

Figure 2:
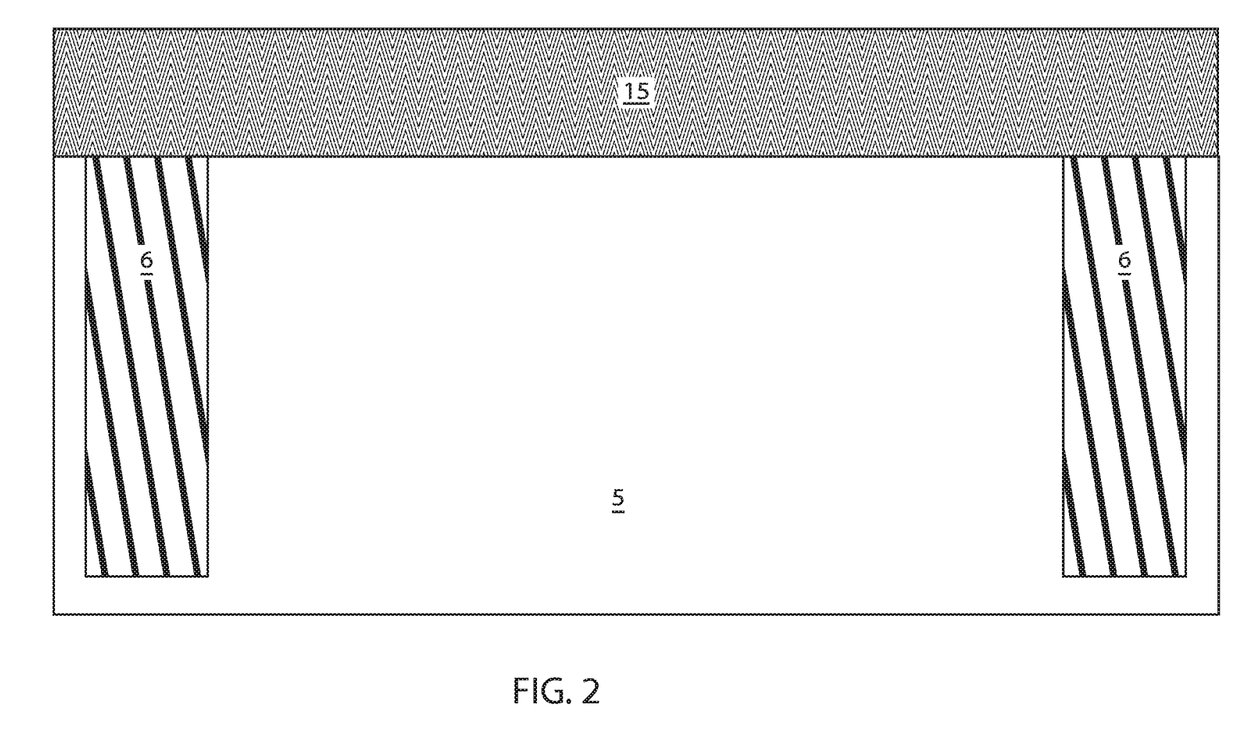
FIG. 2 is a side cross-sectional view of an initial structure for forming a lateral bipolar junction transistor (LBJT) as depicted in FIG. 1, in which the initial structure includes a first III-V semiconductor material epitaxially formed on a substrate III-V semiconductor material, in accordance with one embodiment of the present disclosure.

FIG. 2 depicts one embodiment of an initial structure for forming a lateral bipolar junction transistor (LBJT) as depicted in FIG. 1, in which the initial structure includes a first III-V semiconductor material, for the base region 15, that is epitaxially formed on a substrate III-V semiconductor material that provides the supporting substrate III-V semiconductor material 5. The supporting substrate III-V semiconductor material 5 may be indium phosphide (InP). The supporting substrate III-V semiconductor material 5 may be an indium phosphide (InP) substrate; may be an indium phosphide (InP) layer that is a relaxed layer structure present atop a layer of a type IV semiconductor, such as silicon; or the indium phosphide (InP) that provides the supporting substrate III-V semiconductor material 5 may be present within a trench, e.g., wide aspect ratio trench. Further details for the supporting substrate III-V semiconductor material 5 is provided in the description of the supporting substrate III-V semiconductor material 5 provided above with reference to FIG. 1.

FIG. 2 further depicts epitaxially forming a first III-V semiconductor material, for the base region 15, on the upper surface of the supporting substrate III-V semiconductor material 5. "Epitaxial growth and/or epitaxial deposition" means the growth of a semiconductor material on a deposition surface of a semiconductor material, in which the semiconductor material being grown has substantially the same crystalline characteristics as the semiconductor material of the deposition surface. The term "epitaxial material" denotes a semiconductor material that has substantially the same crystalline characteristics as the semiconductor material that it has been formed on, i.e., epitaxially formed on. In some embodiments, when the chemical reactants are controlled, and the system parameters set correctly, the depositing atoms of an epitaxial deposition process arrive at the deposition surface with sufficient energy to move around on the surface and orient themselves to the crystal arrangement of the atoms of the deposition surface. An epitaxial material has substantially the same crystalline characteristics as the semiconductor material of the deposition surface. For example, an epitaxial film deposited on a {100} crystal surface will take on a {100} orientation. The epitaxial deposition process may be carried out in the deposition chamber of a chemical vapor deposition (CVD) apparatus.

A number of different sources may be used for the deposition of epitaxial type III-V semiconductor material for the III-V semiconductor material layer for the base region 15. In some embodiments, the sources for epitaxial growth of type III-V semiconductor material include liquid or solid sources containing In, Al, As, Ga, N, P elements and combinations thereof and/or a gas precursor selected from the group consisting of Trimethylaluminum $(CH_3)_3Al$, Trimethylgallium $(CH_3)_3Ga$, (TMG), Trimethylindium (TMI) $(CH_3)_3IN$, tertiary-butylphosphine (TBP), tertiary-butylarsine (TBA), phosphine $(PH_3)$, arsine (AsH3) ammonia (NH3), and combinations thereof. The temperature for epitaxial deposition of type III-V semiconductor materials typically ranges from 350° C. to 700° C.

In one embodiment, the first III-V semiconductor material for the base region 15 is indium gallium arsenide (InGaAs). It is noted that other materials may be employed for the first III-V semiconductor material for the base region 15 so long as material of the supporting substrate III-V semiconductor material 5 may be removed selectively to the first III-V semiconductor material for the base region 15. Examples of other type III-V semiconductor materials that may be suitable for first III-V semiconductor material for the base region 15 may include aluminum antimonide (AlSb), aluminum arsenide (AlAs), aluminum nitride (AlN), aluminum phosphide (AlP), gallium arsenide (GaAs), gallium phosphide (GaP), aluminum gallium arsenide (AlGaAs), gallium arsenide nitride (GaAsN), gallium arsenide antimonide (GaAsSb), aluminum gallium nitride (AlGaN), aluminum gallium phosphide (AlGaP), aluminum gallium arsenide phosphide (AlGaAsP), aluminum gallium arsenide nitride (AlGaAsN), gallium arsenide antimonide nitride (GaAsSbN), and combinations thereof.

The III-V semiconductor material layer for the base region 15 is doped to an n-type or p-type conductivity. The III-V semiconductor material layer for the base region 15 may be in situ doped. The term "in situ" denotes that the dopant that dictates the conductivity type of a material is introduced while the material is being formed, e.g., during the epitaxial growth process. The term "p-type" refers to the addition of impurities to an intrinsic semiconductor that creates deficiencies of valence electrons. As used herein, "n-type" refers to the addition of impurities that contributes free electrons to an intrinsic semiconductor. To provide an n-type dopant to the III-V semiconductor material, the dopant may be an element from Group IV or VI of the Periodic Table of Elements. To provide a p-type dopant to the III-V semiconductor material, the dopant may be an element from Group II or VI of the Periodic Table of Elements. In an III-V semiconductor, atoms from group II act as acceptors, i.e., p-type, when occupying the site of a group III atom, while atoms in group VI act as donors, i.e., n-type, when they replace atoms from group V. Dopant atoms from group IV, such a silicon (Si), have the property that they can act as acceptors or donor depending on whether they occupy the site of group III or group V atoms respectively. Such impurities are known as amphoteric impurities. In some examples, the dopants that dictate the n-type or p-type conductivity may include silicon (Si), iron (Fe), germanium (Ge) and combinations thereof.

Still referring to FIG. 2, in one embodiment, after forming the first III-V semiconductor material for the base region 15, isolation regions 6 may be formed on opposing sides of the region on which the functional features of the lateral bipolar junction are to be formed. The isolation regions 6 may be trench isolation regions. The trench isolation region is formed utilizing, for example, lithography, and etching to form a trench, and filling of the trench with a trench dielectric by a deposition process, such as chemical vapor deposition.

Figure 3:
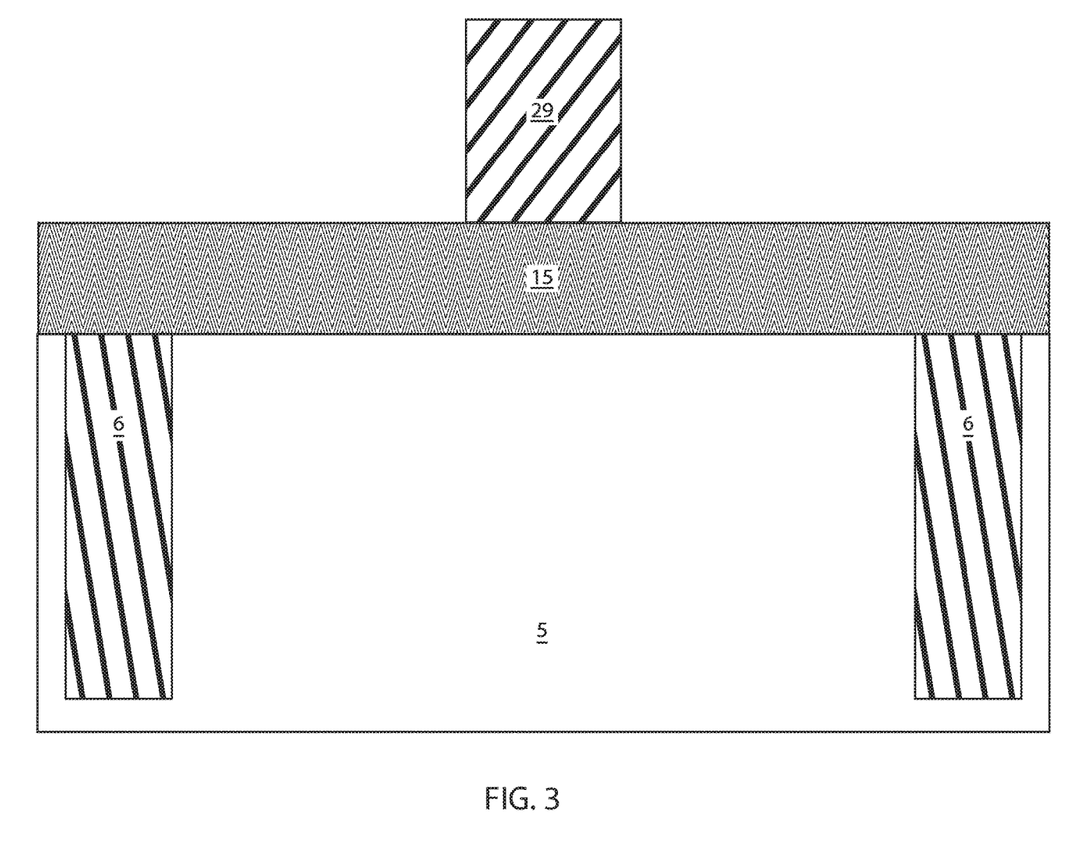
FIG. 3 is a side cross-sectional view of sacrificial extrinsic base structure formed on a base region portion of the first III-V semiconductor material, in accordance with one embodiment of the present disclosure.

FIG. 3 depicts one embodiment of a sacrificial extrinsic base structure 29 being formed on a base region portion of the first III-V semiconductor material. The term "sacrificial" denotes that the extrinsic base structure formed at this process step is removed prior to the final device structure. A functional extrinsic base structure will be substituted for sacrificial extrinsic base structure 29. In one embodiment, the sacrificial material that provides the sacrificial extrinsic base structure 29 may be composed of any material that can be etched selectively to the at least one of the III-V semiconductor material that provides the base region 15. In one embodiment, the sacrificial extrinsic base structure 29 may be composed of a silicon-including material, such as polysilicon. In another embodiment, the sacrificial extrinsic base structure 29 may be composed of a dielectric material, such as an oxide, nitride or oxynitride material, or amorphous carbon. The extrinsic base structure 29 may be formed using deposition (e.g., chemical vapor deposition or spinning of a flowable dielectric) photolithography and etch processes (e.g., reactive ion etching). In some embodiments, the sacrificial extrinsic base structure 29 may be composed of a nitride, amorphous silicon, hydrogen silsesquioxane (HSQ), silicon oxide ($SiO_2$), hafnium oxide ($HfO_2$), or a combination thereof.

Figure 4:
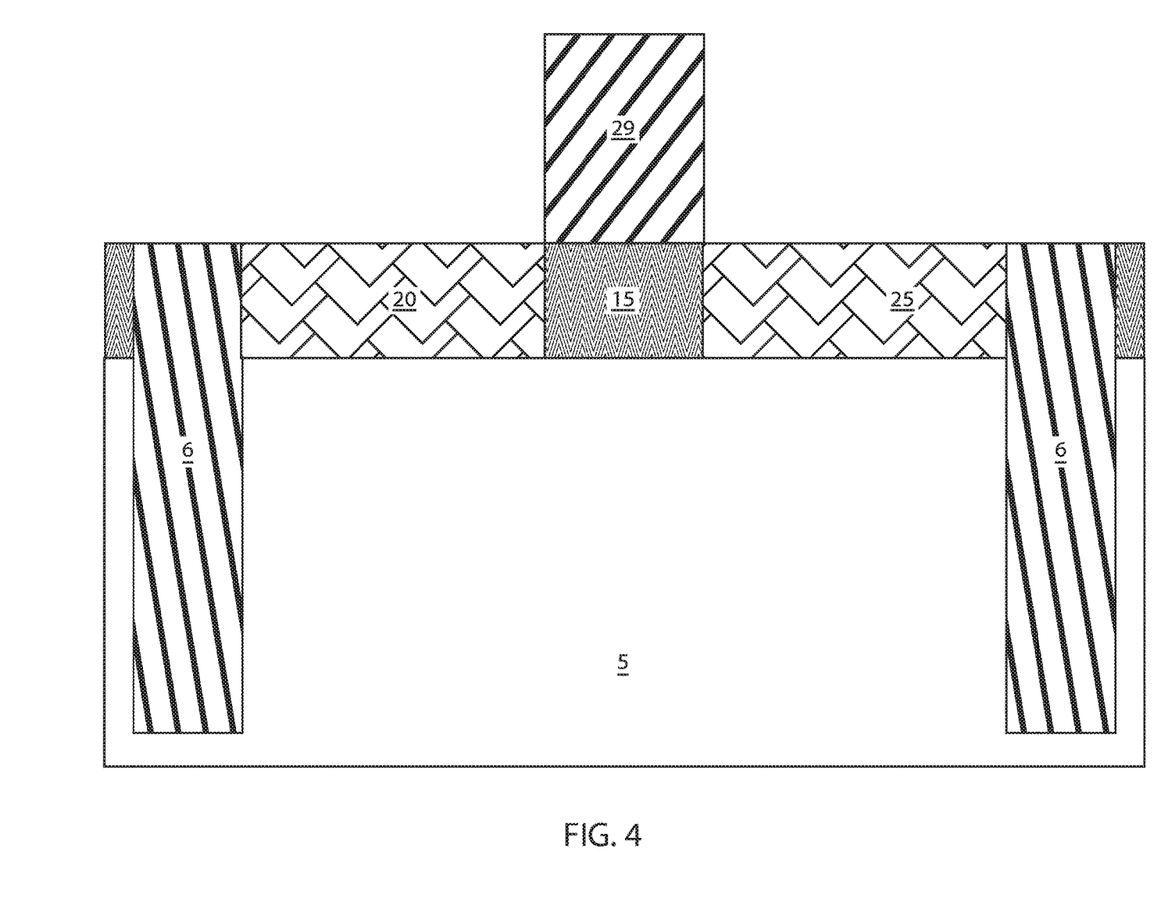
FIG. 4 is a side cross-sectional depicting removing exposed portions of the III-V semiconductor material for the base region selectively to the III-V semiconductor substrate, and epitaxially growing a III-V semiconductor material having a wider band gap than the III-V semiconductor material for the base region to provide the emitter and collector regions on opposing sides of the base region, in accordance with one embodiment of the present disclosure.

FIG. 4 depicts removing exposed portions of the III-V semiconductor material for the base region 15 selectively to the III-V semiconductor substrate 5, and epitaxially growing a III-V semiconductor material having a wider band gap than the III-V semiconductor material for the base region 15 to provide the emitter and collector regions 20, 25 on opposing sides of the base region 15.

FIG. 4 depicts etching the first III-V semiconductor material layer to provide the base region 15 of the LBJT device. In some embodiments, the etch mask, e.g., photoresist mask, that is used in defining the geometry of the sacrificial extrinsic gate structure 29 can be used in the etch process for defining the base region 15. In other embodiments, a separate etch mask may be formed to protect the portion of the first III-V semiconductor material layer that provides the base region 15, or the sacrificial gate structure 29 is used as the etch mask to define the base region 15.

The exposed portions of the first III-V semiconductor material layer may be removed while the portions of the first III-V semiconductor material layer that provides the base region 15 is protected by the overlying sacrificial extrinsic gate structure 29, and any overlying photoresist masks that may be employed. The etch process for etching the first III-V semiconductor material layer may be selective to the supporting substrate III-V semiconductor material layer 5. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 10:1 or greater. The etch process for removing the exposed portions of the lattice matched III-V semiconductor material layer 10 may be a wet etch or a dry etch.

FIG. 4 also depicts epitaxially forming the emitter and collector regions 20, 25 on the exposed portions of the supporting substrate III-V semiconductor material that is exposed by the aforementioned etch process for defining the base region 15. The emitter and collector regions 20, 25 may be composed of single crystalline or polycrystalline material. The emitter and collector regions 20, 25 may be composed of a III-V semiconductor material having a band gap that is the same or greater than the band gap of the base region 15. For example, aluminum (Al) may be incorporated into the second III-V semiconductor material of the emitter region 20 and the collector region 25 to increase the band gap of the material. For example, each of the emitter region 20 and the collector region 25 may be composed of indium gallium aluminum arsenide (InGa(Al)As). It is noted that indium gallium aluminum arsenide (InGa(Al)As) is only one example for the second III-V semiconductor material that provides the emitter region 20 and the collector region 25. For example, the epitaxially formed in-situ doped III-V semiconductor material for the emitter region 20 and the collector region 25 may be composed of at least one of aluminum antimonide (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof, so long as providing a band gap that is equal to or greater than the base region 15.

The epitaxial deposition and in-situ doping process for forming the epitaxially formed in-situ doped single crystal III-V semiconductor material that provides the emitter and collector regions 20, 25 has been described above for forming the first III-V semiconductor material that provides the base region 15. Therefore, the above description for epitaxial grown and in-situ doping for the first III-V semiconductor material that provides the base region 15 is suitable for providing at least one embodiment of forming the material layers for the emitter and collector regions 20, 25. The emitter and collector regions 15, 20 are doped with a conductivity type dopant that is opposite the conductivity type of the base region 15. The dopant that produces the n-type or p-type conductivity may be selected from silicon, germanium and iron. The dopant concentration of the emitter and collector regions 20, 25 may range from $10^{18}$ atoms/cm$^3$ to $10^{21}$ atoms/cm$^3$.

Figure 5:
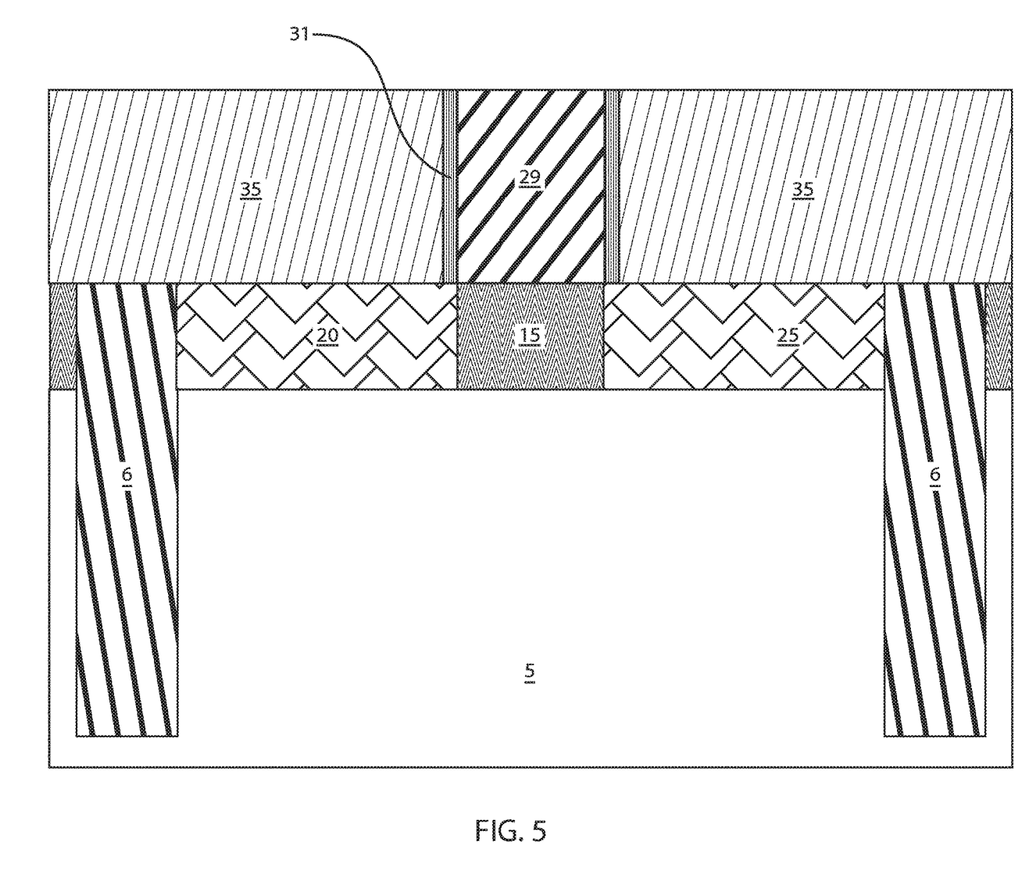
FIG. 5 is a side cross-sectional view depicting forming a spacer on sidewalls of the sacrificial extrinsic base structure, and forming an interlevel dielectric layer having an upper surface coplanar with the upper surface of the interlevel dielectric layer, in accordance with one embodiment of the present disclosure.

FIG. 5 depicts forming a spacer 31 on sidewalls of the sacrificial extrinsic base structure 29, and forming an inter-level dielectric layer 35 having an upper surface coplanar with the upper surface of the sacrificial extrinsic base structure 29. The spacer 31 is typically composed of a dielectric material, such as an oxide, nitride, or oxynitride material. In one example, when the spacer 39 is composed of a nitride, the spacer 31 may be composed of silicon nitride, and when the spacer 39 is composed of oxide, the spacer 31 may be composed of silicon oxide. In another example, the spacer 31 is comprised of silicon nitride or silicon boron carbon nitride (SiBCN). The spacer 31 may be formed using a deposition process, such as chemical vapor deposition (CVD), and an anisotropic etchback method. The spacer 31 may be present on the sidewalls of the sacrificial extrinsic base structure 29, and may have a thickness ranging from 1 nm to 15 nm.

FIG. 5 also depicts depositing an interlevel dielectric layer 35. The interlevel dielectric layer 35 may be any dielectric material, such as an oxide, e.g., silicon oxide, nitride, e.g., silicon nitride, and/or oxynitride. The interlevel dielectric layer 35 may then be planarized, e.g., by chemical mechanical planarization (CMP), to provide an upper surface that is coplanar with the upper surface of the sacrificial extrinsic base structure 29.

Figure 6:
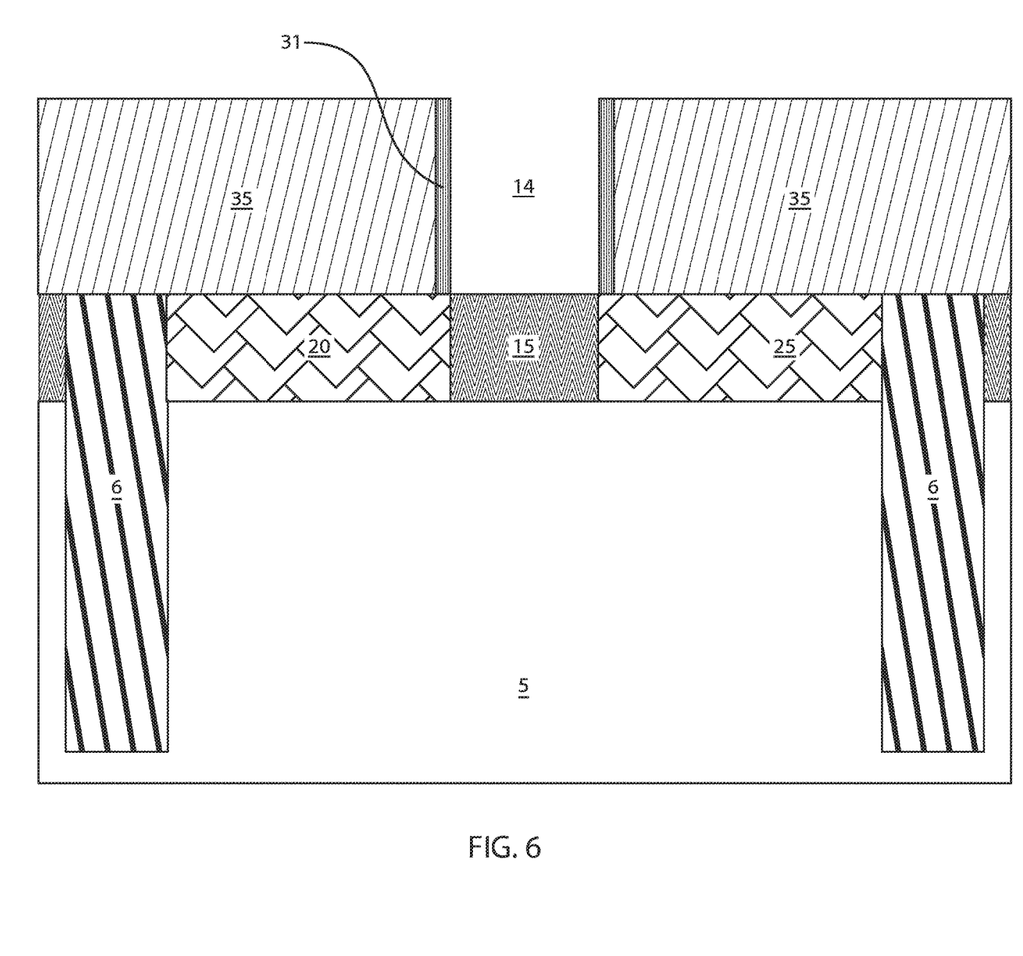
FIG. 6 is side cross-sectional view depicting removing the sacrificial extrinsic base structure.

FIG. 6 depicts removing the sacrificial extrinsic base structure 29 to provide an opening 14 to the base region 15 composed of the first III-V semiconductor material. The extrinsic base structure 29 may be removed using a wet or dry etch process. In one embodiment, the extrinsic base structure 29 may be removed by at least one of an anisotropic etch process, such as reactive ion etch (RIE), or an isotropic etch process, such as a wet chemical etch. In one example, the etch process for removing the extrinsic base structure 29 can include an etch chemistry that is selective to the at first III-V semiconductor material of the base region 15. The etch process for removing the extrinsic base structure 29 may also be selective to the spacer 31.

Figure 7:
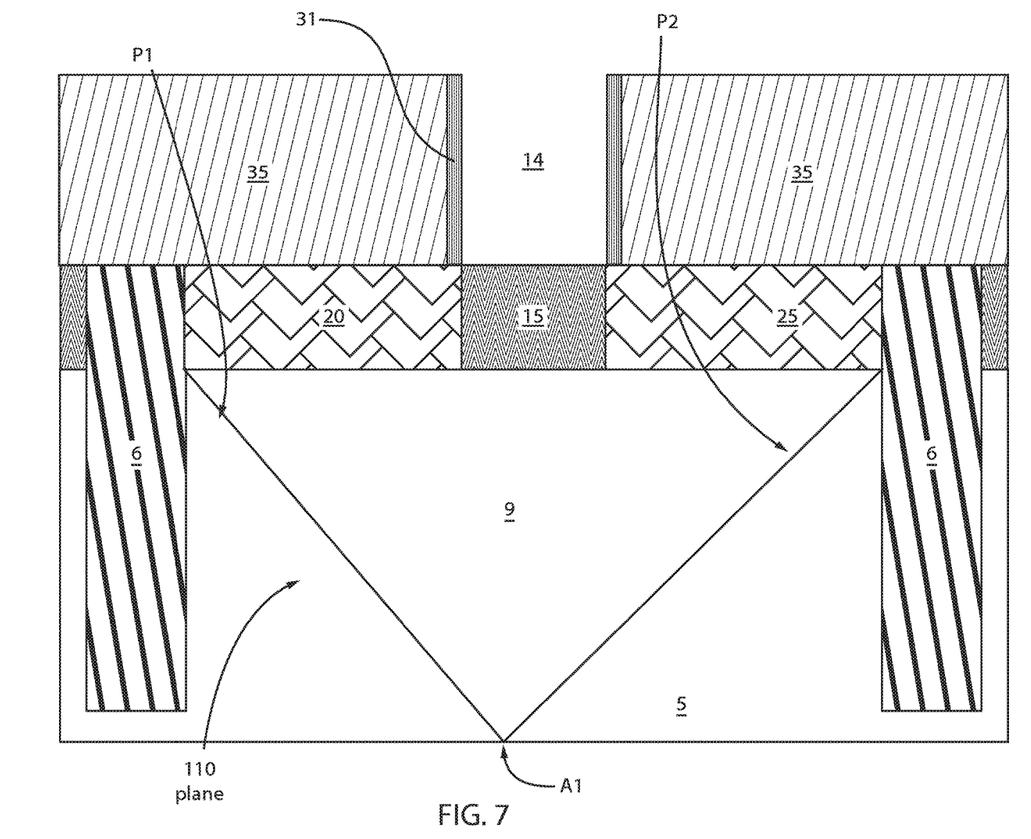
FIG. 7 is a side cross-sectional view depicting etching the III-V semiconductor substrate selectively to facets having a {110} crystalline orientation, in which the etch process provides a trench having the inverted apex geometry underlying at least the base region, in accordance with one embodiment of the present disclosure.

FIG. 7 depicts etching the III-V semiconductor substrate 5 selectively to facets P1, P2 having a {110} crystalline orientation, in which the etch process provides a trench having the inverted apex geometry (apex A1) underlying at least the base region 15. The etch employed at this state of the process flow has an etch chemistry that decreases etch rate at the (110) planes. The etchant is introduced through the opening 14 provided by removing the sacrificial extrinsic base structure 29, and penetrates to the supporting substrate III-V semiconductor material 5 through opening produced by removing portions of the first III-V semiconductor layer that provide the extrinsic base region 15, which extend into and out of the plane of cross-section depicted in FIG. 7. Therefore, in some embodiments, a first etch stage, which can be provided by an anisotropic etch, such as reactive ion etching (RIE) can remove portions of the first III-V semiconductor material layer that provide the base region 15 a positioned along a plane that extends into and out of the page on which the cross-section for FIG. 7 is depicted. This etch step exposes portions of the supporting substrate III-V semiconductor material 5. An etch mask may protect the base portion 14 of the first III-V semiconductor material during this stage of the process flow.

Once the supporting substrate III-V semiconductor material 5 is exposed, a portion of the supporting substrate III-V semiconductor material 5 may be removed selectively to the remaining portion of the first III-V semiconductor material that provides the base region. The etch process for removing the portion of the supporting substrate III-V semiconductor material 5 is selective to facets of the material for the supporting substrate III-V semiconductor material 5 to provide an inverted apex region, i.e., trench 9 having the inverted apex geometry, depicted in FIG. 7.

In some embodiments, the etch process for removing the supporting substrate III-V semiconductor material, e.g., indium phosphide (InP), selectively to the first III-V semiconductor material, e.g., indium gallium arsenide (InGaAs), that provides the base region 15 is a wet chemical etch that includes hydrochloric (HCl) acid. The hydrochloric (HCl) acid etch may include 18.5% hydrochloric (HCl) acid. The hydrochloric (HCl) acid etch composition is selective to {110} crystal plane of the supporting substrate III-V semiconductor material 5, e.g., indium phosphide (InP). In some embodiments, the selective etch of the supporting substrate III-V semiconductor material 5, e.g., indium phosphide (InP), stops at an angle of approximately 45 degrees. This corresponds to a plane belonging to the {110} family for the supporting substrate III-V semiconductor material 5, e.g., indium phosphide (InP). The etch process may start with removing the portion of the supporting substrate III-V semiconductor material 5, e.g., indium phosphide (InP), that is underlying the base region 15, and may continue by over-etching into removing the supporting substrate III-V semiconductor material 5, e.g., indium phosphide (InP), that is underlying the emitter region 20 and the collector region 25. The etch process may stop upon contacting the sidewalls of the isolation regions 6 due to etch selectivity. The etch process may include the facets P1, P2 intersecting at the inverted apex A1 to provide the trench 9 having the inverted apex geometry.

The selective nature of the HCl etch to the indium containing supporting semiconductor III-V material 5 provides an inverted apex region underlying the emitter region 20, base region 15 and collector region 25. The inverted apex region may remain unfilled to provide an air gap underlying the emitter region 20, base region 15 and collector region 25. To provide this embodiment, a sealing dielectric may be deposited to close the opening through which the etchant reached the supporting substrate III-V semiconductor material 5 to provide the trench 9 having the inverted apex geometry. Thereafter, a functional extrinsic base structure 30 is formed in the opening 14 that is formed by removing the sacrificial extrinsic base structure 29, as described below with reference to FIG. 9. In other embodiments, the trench 9 having the inverted apex geometry is filled with a solid dielectric to provide a dielectric region 10 having an inverted apex geometry, as described with reference to FIGS. 8 and 9.

Figure 8:
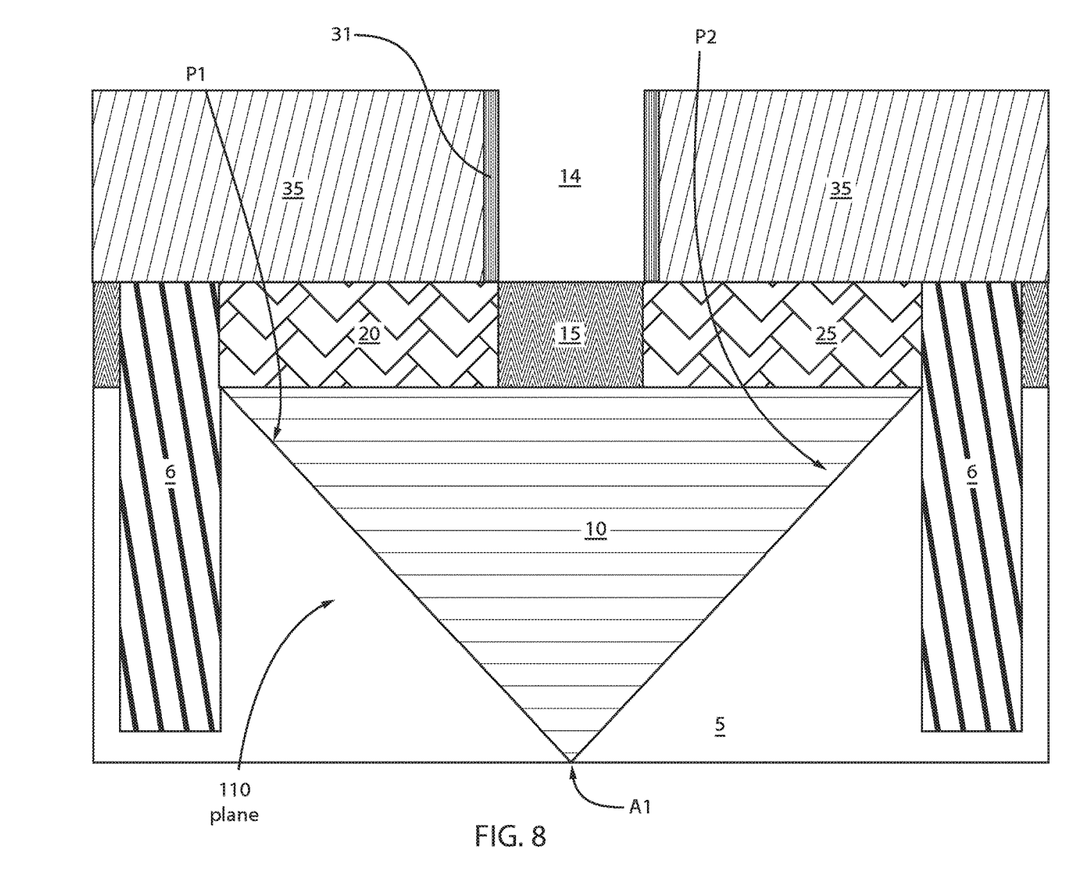
FIG. 8 is a side cross-sectional view depicting filling the trench having the inverted apex geometry with a dielectric material.

FIG. 8 depicts filling the trench 9 having the inverted apex geometry with a dielectric material 10 filling the inverted apex region. The dielectric 10 may be a flowable dielectric material. The flowable dielectric material may be an oxide, such as silicon oxide. It is noted that the composition for the flowable dielectric material is not limited to only oxides, as other dielectric materials may also be suitable for the flowable dielectric material. For example, the flowable dielectric material may be composed of a low-k dielectric material. In some examples, the low-k dielectric that provides the flowable dielectric material may have a dielectric constant of 4.0 or less (measured at room temperature, e.g., 25° C., and 1 atm). For example, a low-k dielectric material suitable for the flowable dielectric material may have a dielectric constant ranging from about 1.0 to about 3.0. Examples of low-k materials suitable for the flowable dielectric material 25 include organosilicate glass (OSG), fluorine doped silicon dioxide, carbon doped silicon dioxide, porous silicon dioxide, porous carbon doped silicon dioxide, spin-on organic polymeric dielectrics (e.g., SILK™), spin-on silicone based polymeric dielectric (e.g., hydrogen silsesquioxane (HSQ) and methylsilsesquioxane (MSQ), and combinations thereof.

The flowable dielectric material that provides the dielectric 10 for filling the trench 9 having the inverted apex geometry may be formed using spin on glass (SOG) deposition and flowable chemical vapor deposition (FCVD). Spin on glass (SOG) compositions typically includes silicon oxide ($SiO_2$) and optionally dopants (either boron or phosphorous) that is suspended in a solvent solution. The SOG is applied the deposition by spin-coating. Spin-coating is a process used to coat the deposition surface with material which is originally in the liquid form, wherein the liquid is dispensed onto the deposition surface in predetermined amount, and the wafer is rapidly rotated. F or example, the deposition surface, e.g., substrate, may be rotated, i.e., spun, to speeds as great as 6,000 rpm. During spinning, liquid is uniformly distributed on the surface by centrifugal forces. The deposited material may then be solidified by a low temperature bake, e.g., baking at temperatures less than 200° C. The deposited material may also be cured using an ultraviolet light application.

The flowable dielectric material that provides the dielectric 10 for filling the trench 9 having the inverted apex geometry may also be deposited using flowable chemical vapor deposition (FCVD). The flowable dielectric material deposited by flowable chemical vapor deposition (FCVD) may be a substantially carbon free silicon oxide ($SiO_2$) material. Flowable chemical vapor deposition (FCVD) provides for a liquid-like film that flows freely into trench like geometries to provide a bottom up, void-free and seam-free fill. Flowable chemical vapor deposition can fill gaps having aspect ratios of up to 30:1. One example, of a flowable chemical vapor deposition process is available from Applied Materials under the tradename Eterna FCVD system.

Figure 9:
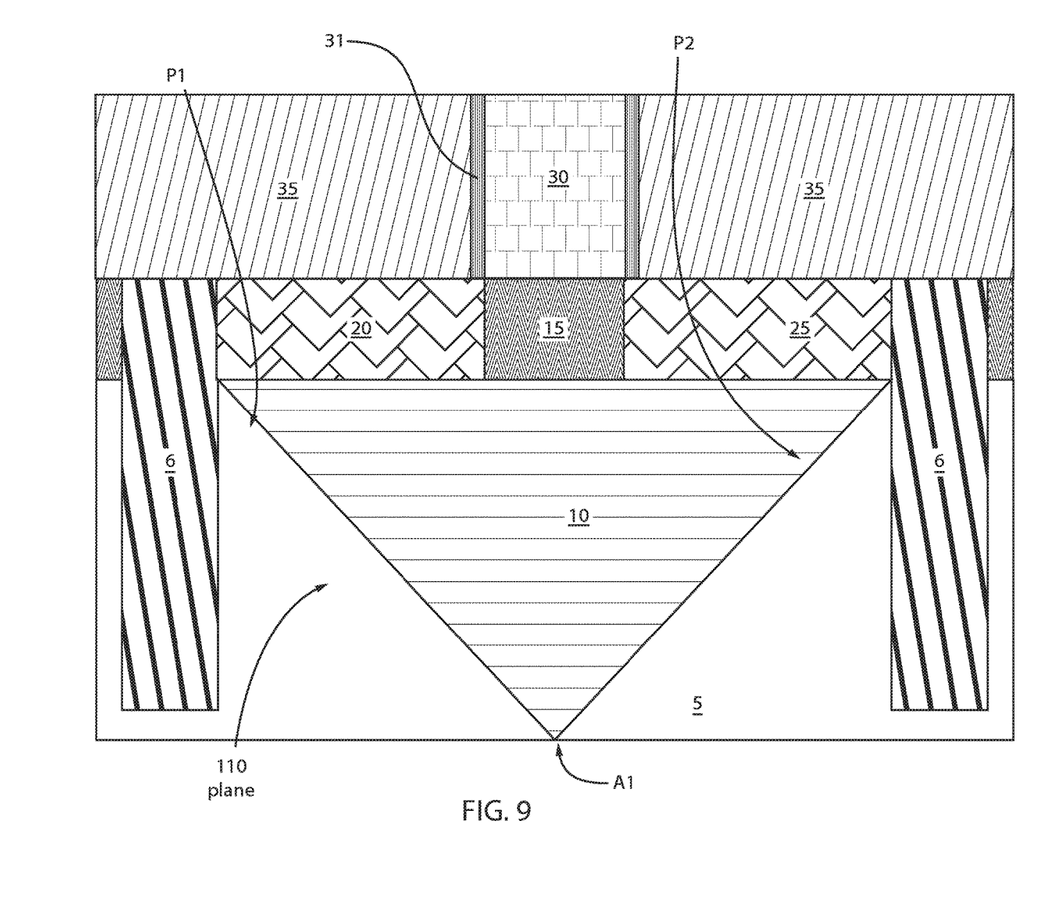
FIG. 9 is a side cross-sectional view depicting forming an extrinsic base region atop the base region of the bipolar junction transistor that is depicted in FIG. 8.

FIG. 9 depicting forming an extrinsic base region 30, i.e., function extrinsic base region, atop the base region 15 of the bipolar junction transistor that is depicted in FIG. 8. The material layer for an extrinsic base region 30 of the LBJT device may include doped polycrystalline or single crystalline III-V semiconductor materials. In some embodiments, the material layer for the base region 30 may be deposited directly on the exposed surface of the base region 15, and may fill an entirety of the opening 14 that is formed by removing the sacrificial extrinsic base region 29. The material layer for the extrinsic base 30 can be formed using similar epitaxial deposition methods as described above for forming the first III-V semiconductor material that provided the base region 15, as well as the epitaxial deposition process that provided the emitter and collector regions 20, 25. In some embodiments, the material layer for the extrinsic base region 30 does not need to be epitaxially formed, e.g., when the material layer for the extrinsic base region 30 is composed of a polycrystalline material. The extrinsic base region 30 may be deposited using chemical vapor deposition in which the deposition conditions are configured to form a polycrystalline material.

The material layer for an extrinsic base region 30 of the LBJT device is typically doped to a same conductivity type as the first III-V semiconductor material layer that provides the base region 15. The dopant concentration of the extrinsic base region 30 may range from $10^{18}$ atoms/$cm^3$ to $10^{21}$ atoms/$cm^3$. The dopant may be implanted by ion implantation, or introduced in situ by gas phase doping.

FIG. 1 depicts one embodiment of forming contacts 36*a*, 36*b*, 36*c* to the emitter region 20, base region 15 and collector region 25, respectively. Forming contacts 36*a*, 36*b*, 36*c* may begin with forming a via opening in the interlevel dielectric layer 35, and filling the via opening with an electrically conductive material. In some embodiments, the via opening may be formed using pattern and etch processing. The electrically conductive material may be a metal, such as tungsten, titanium, aluminum, copper or a combination thereof, which may be deposited using a method, such as physical vapor deposition, e.g., plating and/or sputtering.

The methods and structures that have been described above with reference to FIGS. 1-9 may be employed in any electrical device including integrated circuit chips. The integrated circuit chips including the disclosed structures and formed using the disclosed methods may be integrated with other chips, discrete circuit elements, and/or other signal processing devices as part of either (a) an intermediate product, such as a motherboard, or (b) an end product. The end product can be any product that includes integrated circuit chips, including computer products or devices having a display, a keyboard or other input device, and a central processor.

Having described preferred embodiments of III-V lateral bipolar junction transistor on local facetted buried oxide layer (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A bipolar junction transistor device comprising:
   a base region of a first III-V semiconductor material having a first band gap; and
   emitter and collector regions present on opposing sides of the base region, wherein the emitter and collector regions are comprised of a second III-V semiconductor material having a wider band gap than the first III-V semiconductor material; and
   a dielectric region underlying the base region, emitter region and the collector region, the dielectric region having an inverted apex geometry, wherein sidewalls of the dielectric region extending to an apex of the inverted apex geometry are present on facets of a supporting substrate III-V semiconductor material having a {110} crystalline orientation, the facets extending from the outermost edge of each of the emitter region and the collector region to provide that an upper surface of the dielectric region is in direct contact with a base surface for an entirety of each of said base region and said emitter and collector regions.

2. The bipolar junction transistor of claim 1, wherein the bipolar junction transistor is a lateral bipolar junction transistor.

3. The bipolar junction transistor of claim 1, further comprising an extrinsic region comprised of a doped polycrystalline III-V semiconductor material or a doped single crystalline III-V semiconductor material that is present atop the base region.

4. The bipolar junction transistor of claim 1, wherein the supporting substrate III-V semiconductor material is indium phosphide (InP), and the base region is comprised of indium gallium arsenide (InGaAs).

5. The bipolar junction transistor of claim 1, wherein the emitter region and the collector region are a type III-V semiconductor including aluminum to increase the band gap of the second III-V semiconductor material to be greater than the first III-V semiconductor material.

6. The bipolar junction transistor of claim 1, wherein the dielectric region is comprised of a dielectric selected from the group consisting of organosilicate glass (OSG), fluorine doped silicon dioxide, carbon doped silicon dioxide, porous silicon dioxide, porous carbon doped silicon dioxide, spin-on organic polymeric dielectrics, hydrogen silsesquioxane (HSQ), methylsilsesquioxane (MSQ), and combinations thereof.

7. A bipolar junction transistor comprising:
a substrate of a III-V semiconductor material having a trench with an inverted apex geometry, wherein sidewalls of the trench that lead to an inverted apex are provided by facets of the substrate III-V semiconductor material having a {110} crystalline orientation;
a dielectric fill present within the trench having the inverted apex geometry, the dielectric fill having a planar surface opposite a base of the dielectric fill that is in contact with the inverted apex of the trench; and
a base region present between an emitter region and a collector region of the bipolar junction transistor, wherein an entirety of a base surface for each of the emitter region, the base region and the collector region is present directly on the planar surface of the dielectric fill.

8. The bipolar junction transistor of claim 7, wherein the base region comprises a first III-V semiconductor material having a first band gap; and the emitter and collector regions are comprised of a second III-V semiconductor material having a wider band gap than the first III-V semiconductor material.

9. The bipolar junction transistor of claim 7, further comprising an extrinsic region comprised of a doped polycrystalline III-V semiconductor material or a doped single crystalline III-V semiconductor material that is present atop the base region.

10. The bipolar junction transistor of claim 7, wherein the substrate III-V semiconductor material is indium phosphide (InP).

11. The bipolar junction transistor of claim 7, wherein the base region is comprised of indium gallium arsenide (InGaAs), and the emitter region and the collector region are a type III-V semiconductor including aluminum to increase its band gap to be greater than the band gap of the InGaAs.

12. The bipolar junction transistor of claim 7, wherein the dielectric fill is comprised of a dielectric selected from the group consisting of organosilicate glass (OSG), fluorine doped silicon dioxide, carbon doped silicon dioxide, porous silicon dioxide, porous carbon doped silicon dioxide, spin-on organic polymeric dielectrics, hydrogen silsesquioxane (HSQ), methylsilsesquioxane (MSQ), and combinations thereof.

* * * * *